US006867657B2

(12) United States Patent
Höllinger et al.

(10) Patent No.: US 6,867,657 B2
(45) Date of Patent: Mar. 15, 2005

(54) RELAXATION OSCILLATOR

(75) Inventors: Werner Höllinger, Villach (AT); Lukas Dörrer, Villach (AT)

(73) Assignee: Infineon Technologies AG, München (DE)

(*) Notice: Subject to any disclaimer, the term of this patent is extended or adjusted under 35 U.S.C. 154(b) by 95 days.

(21) Appl. No.: 10/368,672

(22) Filed: Feb. 18, 2003

(65) Prior Publication Data

US 2003/0155982 A1 Aug. 21, 2003

Related U.S. Application Data

(63) Continuation of application No. PCT/EP01/09828, filed on Aug. 24, 2001.

(30) Foreign Application Priority Data

Sep. 19, 2000 (DE) .......................................... 100 46 325

(51) Int. Cl.[7] ................................................. H03B 5/24
(52) U.S. Cl. ....................................... 331/143; 331/111
(58) Field of Search ................................. 331/111, 143

(56) References Cited

U.S. PATENT DOCUMENTS 4,623,851 A * 11/1986 Abou ......................... 331/111

| 5,627,488 A | 5/1997 | Tanzawa et al. |
| 5,793,257 A | 8/1998 | Inanami et al. |
| 6,028,488 A | 2/2000 | Landman et al. |

FOREIGN PATENT DOCUMENTS

EP 0 834 992 A1 2/1996

* cited by examiner

Primary Examiner—David Mis
(74) Attorney, Agent, or Firm—Jenkins, Wilson & Taylor, P.A.

(57) ABSTRACT

The invention relates to an electric circuit for generating a periodic signal comprising: a capacitor device which has a first terminal and a second terminal; a signal node that is connected, via a first signal having a first period is applied; a discharging device that is connected, via a third switching device, to the first terminal and, via a fourth switching device, to the second terminal, whereby the second terminal, via a fifth switching device, and the first terminal, via a sixth switching device, are connected to a first reference potential; and comprising a clock pulse generating device for receiving the first signal and for generating a first switch clock pulse, a second switch clock pulse, and the periodic signal. The first and the second switch clock pulse do not overlap and are inverse with regard to one another. The first, third and fifth switch device can be controlled by the first switch clock pulse, and the second, fourth and sixth switch device can be controlled by the second switch clock pulse. The first and second switch clock pulse and the periodic signal have a second period, which is an even multiple of the first period.

10 Claims, 3 Drawing Sheets

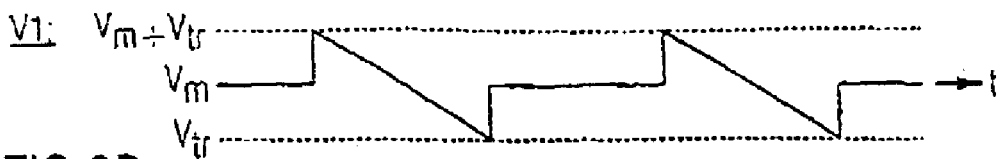
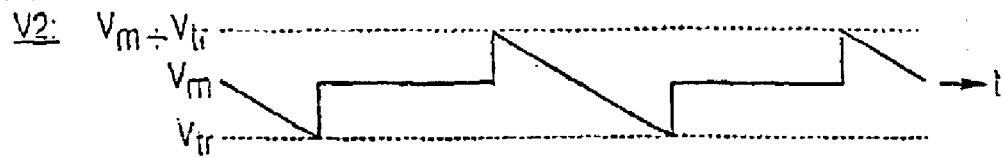
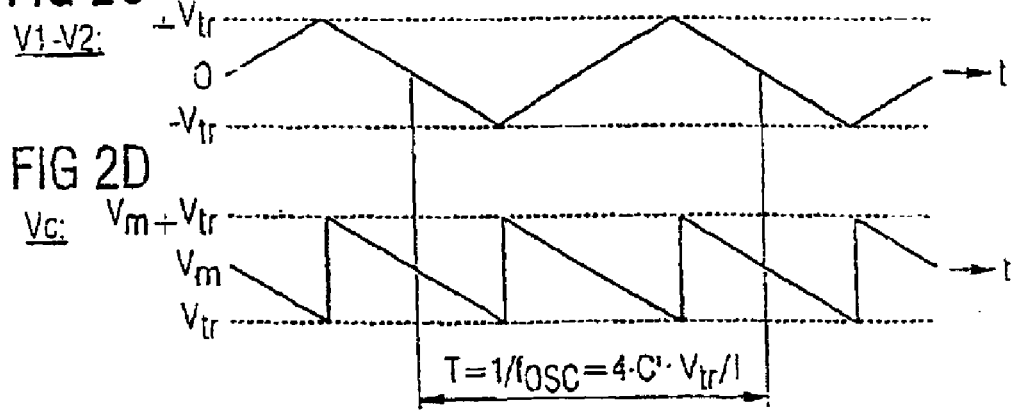
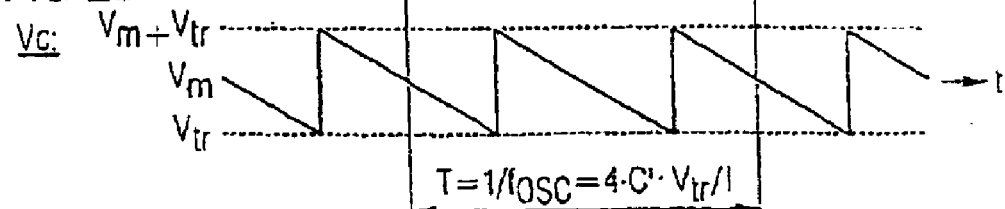
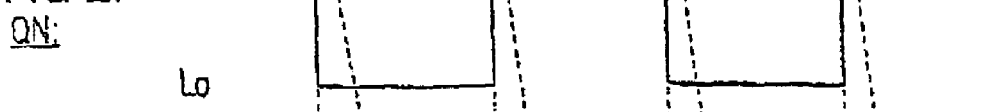
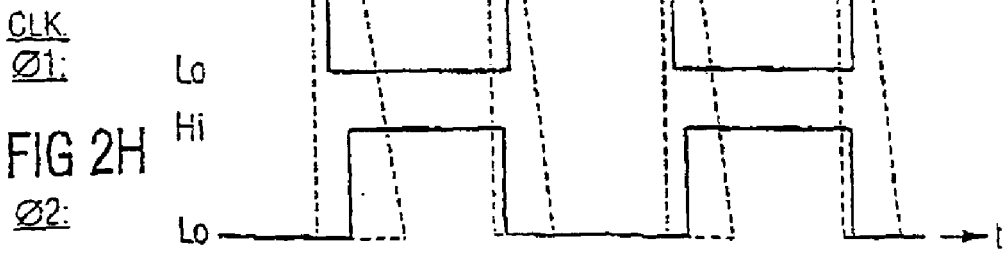

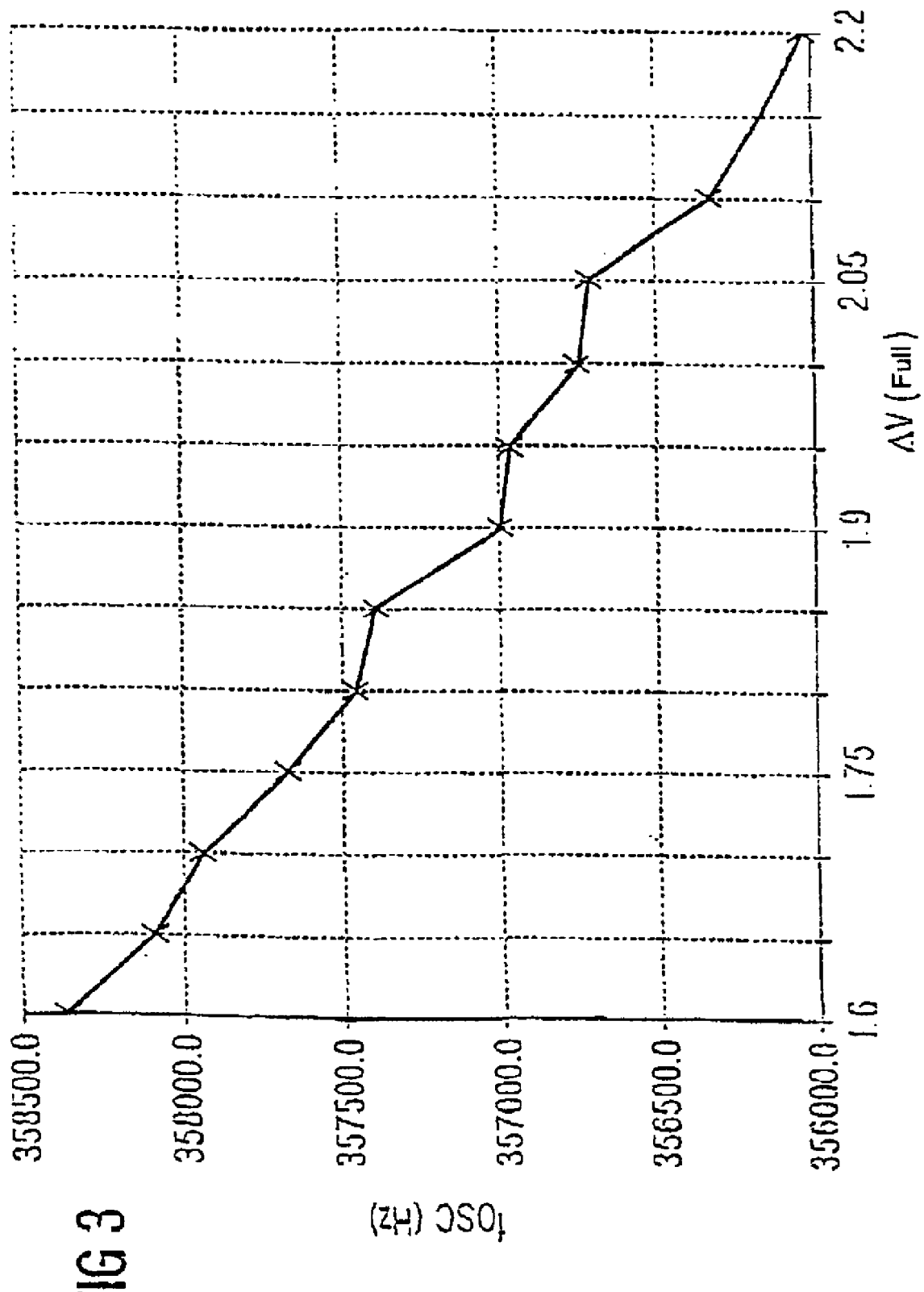

RELAXATION OSCILLATOR

RELATED APPLICATIONS

This application is a continuation of PCT patent application number PCT/EP01/09828, filed Aug. 24, 2001, which claims priority to German patent application number 10046325.8, filed Sep. 19, 2000, the disclosures of each of which are incorporated herein by reference in their entirety.

TECHNICAL FIELD

The present invention relates to an electrical circuit for generating a cyclic signal.

BACKGROUND ART

EP 0834992 A2 discloses a monolithic MOS switched capacitor circuit with an on-chip oscillator.

U.S. Pat. No. 6,028,488 discloses a digitally controlled oscillator with switched capacitor frequency selection.

The simplest method for generating a cyclic signal involves counteracting the damping of an LC resonant circuit using an amplifier. The frequency stability of LC oscillators is not adequate for many applications. For high frequencies, L and C can be integrated. Much better frequency stability can be achieved with quartz oscillators. However, an external component is always necessary with such crystal oscillators.

Another group of oscillators are relaxation oscillators, which generate a cyclic signal by charging and discharging an (integrated/external) capacitance. In that case, the oscillator frequency is essentially dependent upon:

- supply-voltage and temperature dependent current source/sink
- switches in series with frequency-determining resistors;
- a comparator with supply-voltage and temperature dependent hysteresis;
- two comparators whose input stages differ by virtue of the different trigger thresholds and are therefore not matched to one another (mismatch).

SUMMARY OF THE INVENTION

It is therefore an object of the present invention to provide an electrical circuit which allows an oscillator frequency to be generated without an external component, said oscillator frequency being largely independent of supply voltage, temperature and mismatch.

The invention achieves this object by means of the electrical circuit specified in claim 1.

The inventive electrical circuit has the advantage that no external frequency-determining components are necessary. In addition, there is only a single discharging device (e.g. current sink), whereas normal circuits additionally require a switched current source. The influence of normal switches can be largely eliminated by applying switched capacitor technology. There merely remains a residual influence as a result of the charge reversal on parasitic capacitances, which likewise determine frequency. This influence can be minimized by virtue of suitable selection of the capacitance and of the switches.

The idea underlying the present invention is generally that the use of a discharging device and a reference generator in conjunction with switched capacitor technology makes it possible to generate a stable oscillation.

The subclaims contain advantageous developments and improvements of the electrical circuit specified in claim 1.

In line with one preferred development, the clock generation device has a comparator device, one input of which is connected to the signal node, the other input of which is connected to a second reference potential, and the output of which outputs a switching pulse signal having the first period duration.

Advantageously, just a single comparator is necessary, in contrast to the aforementioned normal circuits, which require a comparator with hysteresis or two comparators. The comparator detects only the positive trigger threshold. When this threshold is reached, the charge on the frequency-determining capacitance is reversed with reference to a mid-voltage determined by the first reference potential. This corresponds to the negative trigger threshold in known circuits, with the hysteresis in this case being prescribed only by the reference generator. If the positive trigger threshold moves because the supply voltage changes, the negative threshold moves in the same direction and the frequency-determining hysteresis remains unaltered.

In line with another preferred development, the clock generation device has a frequency divider device for receiving the switching pulse signal and for generating a corresponding second signal having a second period duration, which is twice as long as the first period duration. The oscillation frequency is therefore half as high as the frequency of the first signal on the comparator.

In line with another preferred development, the clock generation device has a clock generator for receiving the second signal and for generating the first switch clock, the second switch clock and the cyclic signal with the second period duration. This clock generator is used essentially for shaping the output signals.

In line with another preferred development, the clock generator is an RS flipflop. This is a particularly simple type of implementation.

In line with another preferred development, the frequency divider device has a pulse-edge-controlled flipflop which receives the switching pulse signal at the C input and delivers the second signal at its inverted Q output, with a feedback loop being provided between the inverted Q output and the D input. This allows an inexpensive frequency divider to be produced.

In line with another preferred development, the clock generation device has a startup logic generator device for prescribing the first and second switch clocks when the circuit is started up. This allows a defined initial state to be provided.

In line with another preferred development, a reference generator device for generating the first and second reference potentials from a first and a second supply potential is provided. This can contain simple cascodes, for example.

In line with another preferred development, the clock generation device is in a form such that the first switch clock and the cyclic signal match. Naturally, the second switch clock and the cyclic signal could also match, however.

In line with another preferred development, the discharging device is a current sink device with a constant current.

An exemplary embodiment of the invention is shown in the drawings and is explained in more detail in the description below.

BRIEF DESCRIPTION OF THE DRAWINGS

In the drawings:

FIGS. 2a) to h) show a schematic illustration of the signal profiles at various nodes in the electrical circuit shown in FIG. 1; and FIG. 3 shows the dependency of the oscillator frequency fosc in the circuit shown in FIG. 1 on the potential difference ΔV=VDD−VSS between the supply potentials.

DETAILED DESCRIPTION OF THE INVENTION

Figure 1:
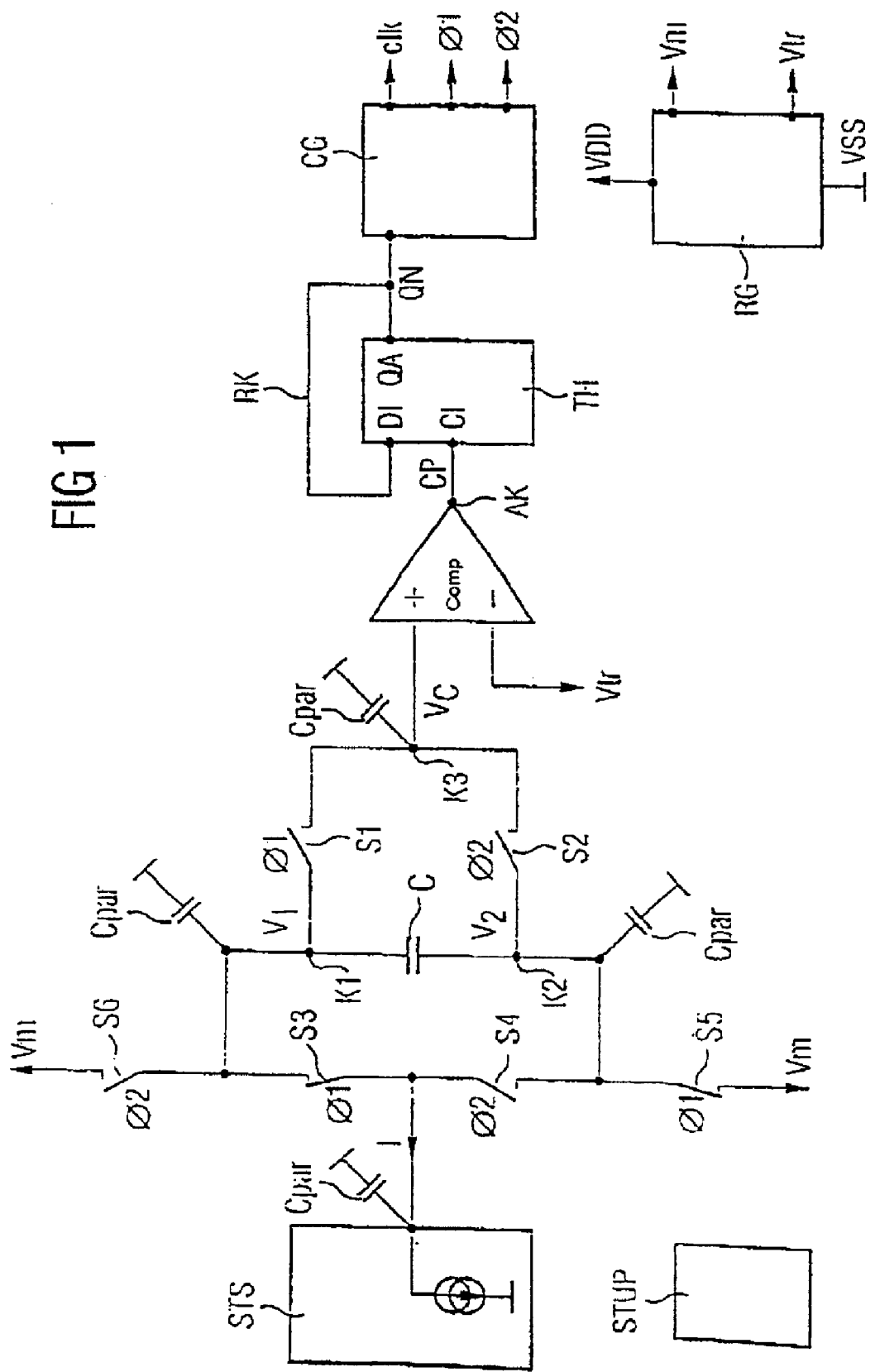
FIG. 1 shows a schematic illustration of an electrical circuit in line with an embodiment of the present invention.

In the figures, identical references denote components which are identical or have identical functions.

STS denotes a current sink device, STUP denotes a startup logic generator device, Cpar denotes parasitic capacitances, S1–S6 denote switch devices, K1, K2 denote a first and a second connection on a frequency-determining capacitance C, I denotes the current in STS, Φ1, Φ2 denote a first and a second switch clock, CLK denotes a cyclic signal or the oscillator frequency, Vm denotes a first reference potential or the mid-voltage, Vtr denotes a second reference potential or the amplitude carrier threshold, K3 denotes a signal node, V1, V2 denote signals on K1 and K2, respectively, Vc denotes the signal on K3, COMP denotes a comparator, +, −denote the inputs of COMP, AK denotes the output of COMP, CP denotes the signal on AK and CI, respectively, TH denotes a frequency divider or flipflop, CI denotes the C input of TH, DI denotes the D input of TH, QA denotes the inverted output of TH, RQ denotes a feedback loop, QN denotes the signal on QA or on a clock generator CG, VDD, VSS denote a first and a second supply potential, RG denotes a reference generator device, fosc denotes the oscillator frequency and t denotes the time.

FIG. 1 shows a schematic illustration of an electrical circuit in line with an embodiment of the present invention.

The electrical circuit in line with this embodiment is a freewheeling oscillator and is used to generate the cyclic signal CLK having a frequency fosc of, by way of example, 350 kHz at a first supply potential of 1.6 V<VDD<2.2 V and a second supply potential VSS of 0 V or ground. The first reference potential or the mid-voltage Vm is 0.8 V, and the second reference potential or the amplitude carrier threshold Vtr is 0.4 V. Forgetting the parasitic capacitances, the oscillator frequency fosc in this case is given by $$fosc = 1/T = I/(4 \cdot C' \cdot Vtr) \quad (1)$$

In this context, C' is the capacitance value of the frequency-determining capacitor C, T is the period duration corresponding to fosc, and I is the constant current of the current sink STS.

The design of the circuit in line with this embodiment is as follows.

The signal node K3, which is connected to the + input of the comparator COMP, is connected to the first connection K1 via the first switch device S1 and to the second connection K2 via the second switch device S2. The signal node K3 has a first signal Vc with a first period duration T/2.

The current sink device STS is connected to the first connection K1 via the third switch device S3 and to the second connection K2 via the fourth switch device S4 and is used for discharging the frequency-determining capacitor C. In this case, the parasitic capacitances Cpar at the points shown likewise have a frequency effect, since their charges constantly need to be reversed.

The second connection K2 is connected to the first reference potential Vm via the fifth switch device S5, and the first connection K1 is connected to the first reference potential Vm via the sixth switch device S6.

The comparator device COMP, the startup logic generator device STUP, the frequency divider device TH and the clock generator CG together form a clock generation device for receiving the first signal Vc and for generating the first switch clock Φ1 the second switch clock Φ2 and the cyclic signal CLK.

The first, third and fifth switch devices S1, S3, S5 can be actuated by the first switch clock Φ1, and the second, fourth and sixth switch devices S2, S4, S6 can be actuated by the second switch clock Φ2. In this case, the first and second switch clocks Φ1, Φ2 do not overlap and are the inverse of one another.

In the state shown in FIG. 1, precisely the first, third and fifth switch devices S1, S3 and S5 are closed.

The clock generation device comprises the comparator device COMP, one input + of which is connected to the signal node K3, the other input − of which is connected to a second reference potential Vtr, and the output AK of which outputs the switching pulse signal CP having the first period duration T/2 in line with the period duration T/2 of the first signal Vc.

The clock generation device also comprises the frequency divider device TH for receiving the switching pulse signal CP and for generating the corresponding second signal QN having the second period duration T, which is twice as long as the first period duration T/2. In this example, the frequency divider device TH is a pulse-edge-controlled flipflop which receives the switching pulse signal CP at the C input CI and delivers the second signal QN at its inverted Q output QA, with the feedback loop RK being provided between the inverted Q output QA and the D input DI.

The clock generation device also comprises the clock generator CG for receiving the second signal QN and for generating the first switch clock Φ1, the second switch clock Φ2 and the cyclic signal CLK with the second period duration T. In this case, the clock generator CG is an RS flipflop. It is used for signal shaping and, in particular, ensures that the first and second switch clocks Φ1, Φ2 do not overlap and are the inverse of one another.

Finally, the clock generation device comprises the startup logic generator device STUP for prescribing the first and second switch clocks Φ1, Φ2 when the circuit is started up, that is to say for initialization.

The reference generator device RG is used for generating the first and second reference potentials Vm and Vtr from the first and second supply potentials VDD and VSS.

In the present case, the clock generation device is in a form such that the first switch clock Φ1 and the cyclic signal CLK match.

FIGS. 2a) to h) show a schematic illustration of the signal profiles on various nodes in the electrical circuit shown in FIG. 1. The illustration depicts the ideal situation, forgetting the parasitic capacitances Cpar.

FIG. 2a) shows the timing of the signal V1 on the connection K1 of the capacitance C. If the switches S2, S4, S6 are initially closed and the switches S1, S3, S5 are initially open, the signal V1 is at the first reference potential Vm via the switch S6.

FIG. 2b) shows the timing of the signal V2 on the connection K2 of the capacitance C. If the switches S2, S4, S6 are initially closed and the switches S1, S3, S5 are initially open, the signal V2 falls to the second reference potential Vtr, since the capacitance C is discharged into the current sink STS via the switches S2, S4.

FIG. 2c) shows the timing for the difference V1−V2 via the capacitance C.

If the signal V2 reaches the second reference potential Vtr, then the signal Vc is applied to the signal node K3 and hence to the + input of the comparator COMP via the switch S2. At the same time, however, the second reference potential Vtr from the reference generator RG is applied directly to the − input of the comparator COMP. This means that the output signal CP produced by the comparator COMP at the output AK is a positive switching edge, as shown in FIG. 2e).

This in turn prompts a change of state for the signal QN at the output QA of the frequency divider TH upon the rising edge of the signal CP and a corresponding delayed change of state in the first and second switch clocks Φ1 and Φ2 and in the cyclic signal CLK at the respective output of the clock generator CG, as shown in FIGS. 2f) to h).

In this case, the delay is such that the first and second switch clocks Φ1 and Φ2 do not overlap, i.e. all the switches S1–S6 are open for a brief length of time. This can be achieved without any difficulty by virtue of the inherent properties of the RS flipflop in the clock generator CG. FIGS. 2g) and h) illustrate this by means of dashed zoom lines which zoom into the respective CP pulse.

The position of the switches S1–S6 now changes such that the switches S2, S4, S6 are open and the switches S1, S3, S5 are closed.

The effect of this is that the signal V1 jumps to Vm+Vtr, since the second reference potential Vtr was on the signal node K3 immediately beforehand and cannot be dissipated on account of its high-impedance environment. At the same time, the signal Vc on the signal node K3 jumps to Vm+Vtr, which results in the signal CP at the output AK of the comparator COMP immediately falling again.

Next, the signal V1 falls from the value Vm+Vtr to the second reference potential Vtr, since the capacitance C is discharged into the current sink STS via the switches S1, S3. In this case, the signal V2 is at the first reference potential Vm via the switch S5.

If the signal V1 reaches the second reference potential Vtr, a new switching pulse in the signal CP is triggered at the output AK of the comparator COMP.

This results in a fresh change of state in the signal QN at the output QA of the frequency divider TH upon the rising edge of the signal CP and a corresponding delayed change of state in the first and second switch clocks Φ1 and Φ2 and in the cyclic signal CLK at the respective output of the clock generator CG, as shown in FIGS. 2f) to h). It can clearly be seen that the frequency divider TH doubles the period duration from T/2 to T, that is to say the first and second switch clocks Φ1 and Φ2 and the cyclic signal CLK have the period duration T.

This fresh change of state changed the position of the switches S1–S6 such that the switches S2, S4, S6 are closed again and the switches S1, S3, S5 are open again.

These changes of state in the switch clocks Φ1 and Φ2 continue cyclically, as can be seen in FIGS. 2a) to h).

FIG. 3 shows the dependency of the oscillator frequency fosc in the circuit shown in FIG. 1 on the potential difference ΔV=VDD−VSS between the supply potentials.

It can clearly be seen that the dependency is marginal and is just 2500 Hz over the potential difference interval of 0.6 V under consideration.

Although the present invention has been described above with reference to a preferred exemplary embodiment, it is not limited thereto, but rather can be modified in a wide variety of ways.

In particular, the parameter ranges mentioned for the voltages, frequencies and component sizes are merely exemplary and can be altered as desired.

In addition, instead of doubling the period through appropriate division of the signal QN, it is possible to set a second period duration in the clock generator which is any desired even-numbered multiple of the first period duration.

Additionally, the discharging device can also be a resistor R or a current source instead of the current sink with constant current I.

| List of references | |
|---|---|
| STS | Current sink device, discharging device |
| STUP | Startup logic generator device |
| Cpar | Parasitic capacitance |
| S1–S6 | Switch devices |
| K1, K2 | First, second connection on C |
| C | Frequency-determining capacitance |
| I | Current |
| Φ1, Φ2 | First, second switch clock |
| CLK | Cyclic signal, oscillator frequency |
| Vm | First reference potential, mid-voltage |
| Vtr | Second reference potential, amplitude carrier threshold |
| K3 | Signal node |
| V1, V2 | Signal on K1, K2 |
| Vc | Signal on K3 |
| COMP | Comparator |
| +,− | Inputs of COMP |
| AK | Output of COMP |
| CP | Signal on AK or CI |
| TH | Frequency divider, flipflop |
| CI | C input of TH |
| DI | D input of TH |
| QA | Inverted output of TH |
| RK | Feedback loop |
| QN | Signal on QA or on CG |
| VDD, VSS | First, second supply potential |
| RG | Reference generator device |
| t | Time |
| fosc | Oscillator frequency |

What is claimed is:

1. Electrical circuit for producing a cyclic signal having:
   (a) a capacitor device which has a first connection and a second connection;
   (b) a signal node which is connected via a first switch device to the first connection and via a second switch device to the second connection and carries a first signal having a first period duration;
   (c) a charging and discharging device which is connected via a third switch device to the first connection and via a fourth switch device to the second connection;
   where the second connection is connected to a first reference potential via a fifth switch device, and the first connection is connected to the first reference potential via a sixth switch device; and a clock generation device for receiving the first signal and for generating a first switch clock, a second switch clock and the cyclic signal; where the first and second switch clocks do not overlap and are the inverse of one another; the first, third and fifth switch devices can be actuated by the first switch clock, and the second, fourth and sixth switch devices can be actuated by the second switch clock; and the first and second switch clocks and the cyclic signal have a second period duration, which is an even-numbered multiple of the first period duration.

2. Electrical circuit according to claim 1, wherein the clock generation device has a comparator device, one input of which is connected to the signal node, the other input of which is connected to a second reference potential, and the output of which outputs a switching pulse signal having the first period duration.

3. Electrical circuit according to claim 2, wherein the clock generation device has a frequency divider device for receiving the switching pulse signal and for generating a corresponding second signal having a second period duration, which is twice as long as the first period duration.

4. Electrical circuit according to claim 3, wherein the clock generation device has a clock generator for receiving the second signal and for generating the first switch clock, the second switch clock and the cyclic signal with the second period duration.

5. Electrical circuit according to claim 4, wherein the clock generator is an RS flipflop.

6. Electrical circuit according to claim 3, wherein the frequency divider device has a pulse-edge-controlled flipflop which receives the switching pulse signal at the C input and delivers the second signal at its inverted Q output, with a feedback loop being provided between the inverted Q output and the D input.

7. Electrical circuit according to claim 1, wherein the clock generation device has a startup logic generator device for prescribing the first and second switch clocks when the circuit is started up.

8. Electrical circuit according to claim 1, wherein a reference generator device for generating the first and second reference potentials from a first and a second supply potential.

9. Electrical circuit according to claim 1, wherein the clock generation device is in a form such that the first switch clock and the cyclic signal match.

10. Electrical circuit according to claim 1, wherein the discharging device is a current sink device with a constant current.

* * * * *